United States Patent
Tsai et al.

(10) Patent No.: US 12,267,594 B2
(45) Date of Patent: Apr. 1, 2025

(54) IMAGE COMPENSATION CIRCUIT AND METHOD

(71) Applicant: NOVATEK Microelectronics Corp., Hsin-Chu (TW)

(72) Inventors: Jung-Yu Tsai, New Taipei (TW); Chen-Tsung Wu, Kaohsiung (TW); Kuan-Lin Wu, Hsinchu (TW); Hung-Yu Yang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 503 days.

(21) Appl. No.: 17/697,898

(22) Filed: Mar. 17, 2022

(65) Prior Publication Data

US 2023/0164463 A1    May 25, 2023

(30) Foreign Application Priority Data

Nov. 22, 2021 (TW) .................... 110143327

(51) Int. Cl.
*H04N 23/71* (2023.01)
*G06V 40/12* (2022.01)
(Continued)

(52) U.S. Cl.
CPC ............ *H04N 23/71* (2023.01); *G06V 40/12* (2022.01); *G06V 40/13* (2022.01); *G06V 40/1318* (2022.01); *G06V 40/1335* (2022.01); *G06V 40/1347* (2022.01); *G06V 40/1388* (2022.01); *G06V 40/1394* (2022.01); *H03M 1/18* (2013.01); *H04N 23/70* (2023.01);
(Continued)

(58) Field of Classification Search
CPC ........ H04N 23/71; H04N 23/70; H04N 25/51; H04N 25/745; H04N 25/77; H04N 25/78; H04N 25/772; H04N 25/61; G06V 40/12; G06V 40/13; G06V 40/1318; G06V 40/1335; G06V 40/1347; G06V 40/1388; G06V 40/1394; H03M 1/18

See application file for complete search history.

(56) References Cited

U.S. PATENT DOCUMENTS

| | | | |
|---|---|---|---|
| 2020/0184185 A1 | 6/2020 | Mackey | |
| 2020/0285829 A1* | 9/2020 | Chang | ............... G06V 40/1347 |
| 2021/0142085 A1* | 5/2021 | Huang | ..................... G06T 5/00 |

FOREIGN PATENT DOCUMENTS

| | | |
|---|---|---|
| CN | 104079833 A | 10/2014 |
| CN | 112784665 A | 5/2021 |
| TW | 202034145 A | 9/2020 |

* cited by examiner

*Primary Examiner* — Abhishek Sarma
(74) *Attorney, Agent, or Firm* — Winston Hsu

(57) ABSTRACT

An image compensation circuit for an image sensor includes a gain amplifier, a compensation control circuit, a memory and a digital-to-analog converter (DAC). The gain amplifier is used for receiving a plurality of image signals from the image sensor and amplifying the plurality of image signals. The compensation control circuit is used for generating a plurality of compensation values for the plurality of image signals. The memory, coupled to the compensation control circuit, is used for storing the plurality of compensation values. The DAC, coupled to the memory and the gain amplifier, is used for converting the plurality of compensation values into a plurality of compensation voltages, respectively, to compensate the plurality of image signals with the plurality of compensation voltages.

22 Claims, 10 Drawing Sheets

(51) Int. Cl.
*G06V 40/13* (2022.01)
*H03M 1/18* (2006.01)
*H04N 23/70* (2023.01)
*H04N 25/51* (2023.01)
*H04N 25/71* (2023.01)
*H04N 25/77* (2023.01)
*H04N 25/772* (2023.01)
*H04N 25/78* (2023.01)

(52) U.S. Cl.
CPC ........... *H04N 25/51* (2023.01); *H04N 25/745* (2023.01); *H04N 25/77* (2023.01); *H04N 25/78* (2023.01); *H04N 25/772* (2023.01)

IMAGE COMPENSATION CIRCUIT AND METHOD

BACKGROUND OF THE INVENTION

1. Field of the Invention

The present invention relates to an image compensation circuit and method, and more particularly, to an image compensation circuit and method used for an optical image sensor.

2. Description of the Prior Art

In recent years, optical fingerprint recognition has become one of the most popular fingerprint recognition schemes. In an optical fingerprint sensor, due to the feature of the sensing element, a difference of the relative illumination (RI) may be generated in the output sensing signals. This RI difference may cause that the back-end signals are easily saturated. Please refer to FIG. 1, which is a schematic diagram of a general optical fingerprint sensor module 10. As shown in FIG. 1, the optical fingerprint sensor module 10 includes a panel 102, a lens 104 and a sensor 106, which are superimposed to form the modular structure. The operational principle of the optical fingerprint sensor module 10 is that a light source of the panel 102 delivers light to the place on which a finger presses. After the light irradiates the finger and reflects by the fingerprint, the reflected light may pass through the structure of the panel 102 and then reach the lens 104. The lens 104 collects the light so that the light can reach the pixels in the sensor 106. The pixels may convert the sensed light intensity into voltage signals, which will be processed by the back-end circuit to output an entire fingerprint image.

As shown in FIG. 1, in the structure of the optical fingerprint sensor module 10, the path of the light reflected from the finger to reach the sensor 106 may pass through the structures of the panel 102 and the lens 104. Due to the differences between the devices' characteristics and the assembly mismatch, the RI may appear to have significant variations on different positions of the sensor 106. Such differences include the distance variations between respective module space such as the variations of thickness of the materials and the variations generated in staking the modules (e.g., as shown in FIG. 1, the height z1, z2 or z3 of each part of the module may possess an error), the difference of the light absorption rates of different modules, the difference between the uniformity and illumination of the display light spots, and the light passing through the panel 102 which is easily influenced by its structure, process variations of the curvature of the lens 104, and the assembly mismatch that may appear in the assembly process of the modules, causing the lens 104 to tilt and increasing the contrast of brightness. All of the above factors generate variations in the light focus behavior of the optical fingerprint sensor module 10, resulting in errors appearing in the output image signals.

Please refer to FIG. 2, which is a schematic diagram of the RI of the lens 104. As shown in FIG. 2, based on the optical feature of the lens 104, the central region (with shorter distance from the lens center) has higher RI and the peripheral region (with longer distance from the lens center) has lower RI. Therefore, there is a fixed pattern offset where the central region of the lens usually has higher brightness and the peripheral region of the lens usually has lower brightness, as the circles of equivalent brightness shown in FIG. 2.

Please refer to FIG. 3, which illustrates fingerprint images of different fingerprint sensor modules. Among these images, figure (a) is a normal fingerprint image, where a round fingerprint is clearly shown, and the center is brighter and the peripheral is darker. Figure (b) shows the influence caused by a slightly tilted lens, where it can be seen that the right-hand side of the fingerprint image appears a black area blocking the fingerprint image. Figure (c) is a diagram showing that the lens is tilted severely, where the upper-left corner of the image appears an obvious black image, causing that the light sensing area capable of fingerprint detection at the upper-left side shrinks significantly.

Thus, there is a need to provide an image compensation circuit and method used for the optical fingerprint sensor module 10, to compensate for various factors such as the lens feature, device variations, assembly mismatches, and lens tilt that cause errors and offsets on the image signals.

SUMMARY OF THE INVENTION

It is therefore an objective of the present invention to provide an image compensation circuit and method for an image sensor, to compensate for the errors of the relative illumination (RI) generated from various variations from light emission to imaging in the sensor.

An embodiment of the present invention discloses an image compensation circuit for an image sensor. The image compensation circuit comprises a gain amplifier, a compensation control circuit, a memory and a digital-to-analog converter (DAC). The gain amplifier is used for receiving a plurality of image signals from the image sensor and amplifying the plurality of image signals. The compensation control circuit is used for generating a plurality of compensation values for the plurality of image signals. The memory, coupled to the compensation control circuit, is used for storing the plurality of compensation values. The DAC, coupled to the memory and the gain amplifier, is used for converting the plurality of compensation values into a plurality of compensation voltages, respectively, to compensate the plurality of image signals with the plurality of compensation voltages.

Another embodiment of the present invention discloses an image compensation method for an image compensation circuit. The image compensation method comprises steps of: receiving a plurality of image signals from an image sensor and amplifying the plurality of image signals; generating a plurality of compensation values for the plurality of image signals, and storing the plurality of compensation values in a memory; and converting the plurality of compensation values into a plurality of compensation voltages, respectively, to compensate the plurality of image signals with the plurality of compensation voltages.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
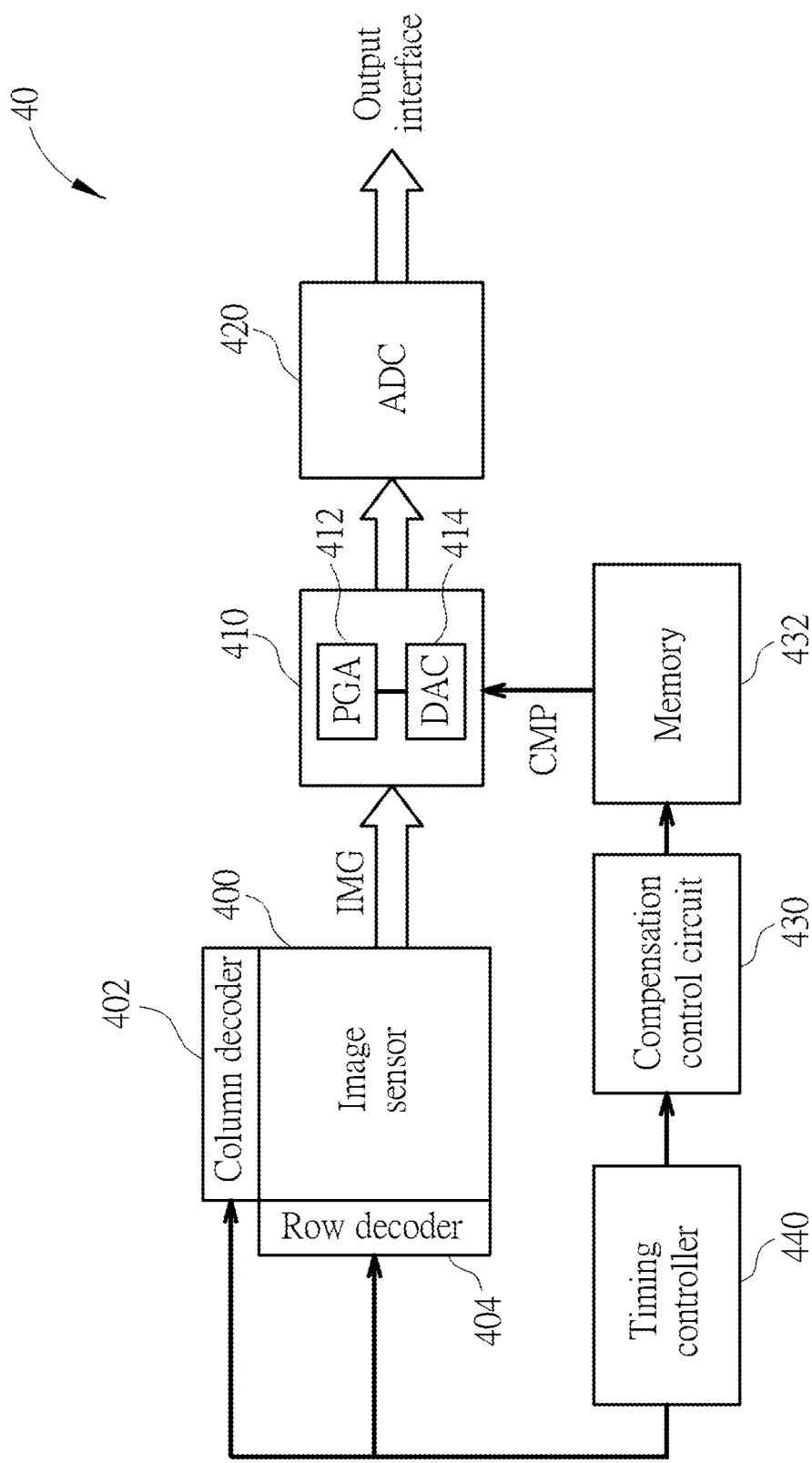
FIG. 4 is a schematic diagram of an image compensation circuit according to an embodiment of the present invention.

Please refer to FIG. 4, which is a schematic diagram of an image compensation circuit 40 according to an embodiment of the present invention. The image compensation circuit 40 includes an image sensor 400, an analog front-end (AFE) circuit 410, an analog-to-digital converter (ADC) 420, a compensation control circuit 430, a memory 432 and a timing controller 440. The image sensor 400 includes a plurality of sensing pixels arranged as an array, where each sensing pixel includes alight sensing element (such as a photodiode) capable of sensing light and converting the light intensity into image signals IMG in voltage or current form. In an embodiment, the image sensor 400 may be an optical fingerprint sensor, for detecting light reflected from a finger to perform fingerprint sensing. The AFE circuit 410, coupled to the image sensor 400, may receive the image signals IMG from the image sensor 400 and process the image signals IMG. In detail, the AFE circuit 410 includes a programmable gain amplifier (PGA) 412 and a digital-to-analog converter (DAC) 414. The PGA 412 may amplify the image signals IMG received from the image sensor 400, where the gain magnitude may be adjusted according to system requirements. The DAC 414 may convert compensation values CMP used for the image signals IMG into corresponding compensation voltages, to use the compensation voltages to compensate the image signals IMG. After the image signals IMG are completely amplified and compensated in the AFE circuit 410, the ADC 420 may convert the image signals IMG in voltage form into digital codes, to output the image data in the digital form through an image output interface to a back-end processor to perform fingerprint recognition. The output interface may be, for example, a serial peripheral interface (SPI), but not limited thereto.

The timing controller 440, coupled to the image sensor 400, is used for controlling sensing operations of the image sensor 400. As mentioned above, the image sensor 400 includes an array of sensing pixels, and the timing controller 440 is used for controlling the timing of image sensing performed by the plurality of sensing pixels and outputting the image signals IMG. In detail, the image sensor 400 may be deployed with a column decoder 402 and a row decoder 404. The column decoder 402 may drive the operations of the pixels column by column, and the row decoder 404 may drive the operations of the pixels row by row. The timing controller 440 may control the sensing pixels in the image sensor 400 through interactive controls of the column decoder 402 and the row decoder 404. In general, the optical fingerprint sensing operations include reset, exposure and sample operations, and the timing controller 440 may control each sensing pixel to follow a predetermined timing scheme to perform the above sensing operations and output the image signals IMG.

Figure 1:
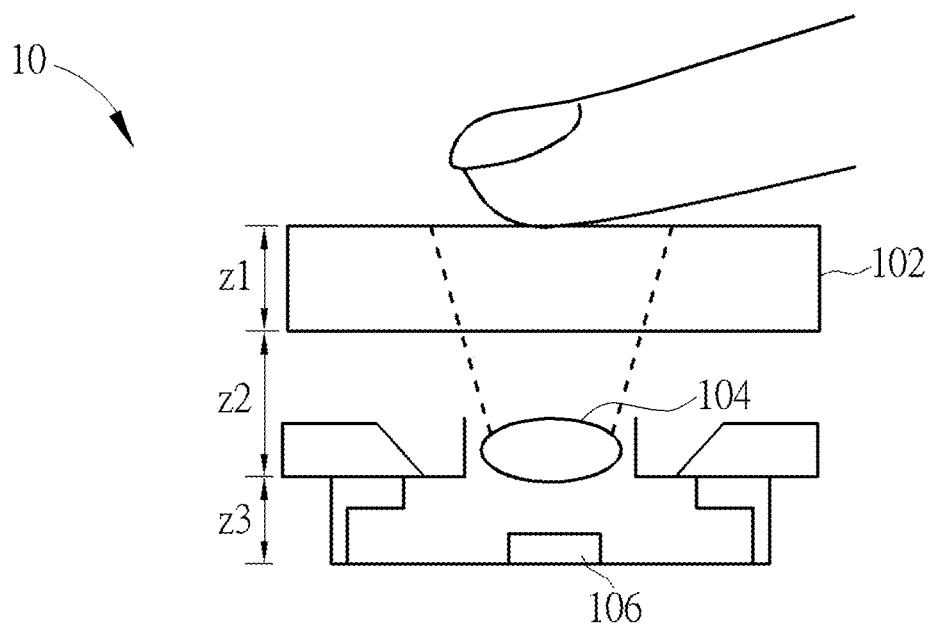
FIG. 1 is a schematic diagram of a general optical fingerprint sensor module.
Figure 2:
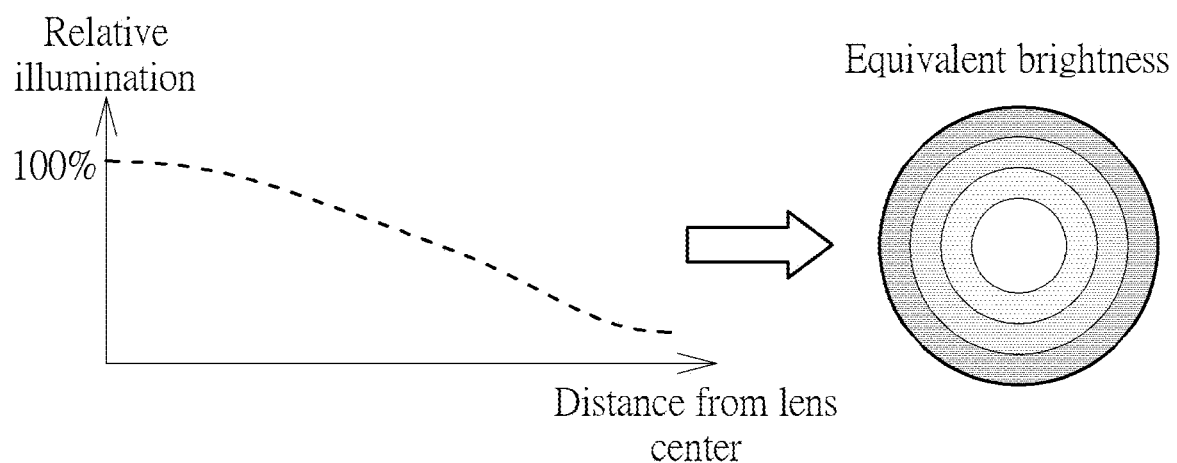
FIG. 2 is a schematic diagram of the RI of the lens.

The compensation control circuit 430 may generate the compensation values CMP used for the image signals IMG. The compensation values CMP may be used to compensate for the relative illumination (RI) errors of the image signals IMG. As can be seen in FIG. 2, the lens feature causes that different sensing pixels have different RI; hence, each pixel has its corresponding compensation value CMP, to compensate for the difference of RI. In such a situation, the timing controller 440 may be coupled to the compensation control circuit 430. In addition to controlling the timing of the sensing pixels outputting the image signals IMG, the timing controller 440 may also provide the coordinate information of the sensing pixels for the compensation control circuit 430, allowing the compensation control circuit 430 to generate the compensation value CMP respectively corresponding to each of the sensing pixels according to the coordinate information and store the compensation values CMP in the memory 432. The memory 432 may be a buffer implemented with D flip-flops, for example. When the sensing pixels output the image signals IMG to the AFE circuit 410, the DAC 414 may extract the compensation values CMP corresponding to the sensing pixels from the memory 432, convert the compensation values CMP into the corresponding compensation voltages, and then add the compensation voltages to the received image signals IMG to perform compensation.

In an embodiment, the image signal IMG may first be amplified by the PGA 412, and then compensated through the compensation voltage. Alternatively, the image signal IMG may first be compensated through the compensation voltage, and then amplified by the PGA 412. Those skilled in the art may select an appropriate compensation method according to practical requirements, and the compensation methods should not be used to limit the scope of the present invention.

In an embodiment, the compensation voltage may be a deduction value to be applied to the image signal IMG; that is, the voltage value of the image signal IMG may deduct the compensation voltage to eliminate the influences of the RI. In such a situation, as for a pixel having greater RI, the compensation control circuit 430 may generate a greater compensation value CMP to deduct a larger level of voltage from the image signal IMG. As for a pixel having smaller RI, the compensation control circuit 430 may generate a smaller compensation value CMP to deduct a smaller level of voltage from the image signal IMG. As a result, the influences resulting from RI variations between different pixels may be eliminated, so as to increase the uniformity of RI, so that the overall image signals IMG may fall on similar levels.

Therefore, after the image signals IMG are compensated, the deviation caused by lens difference and/or assembly mismatch may be eliminated, so that the levels of the image signals IMG output by the pixels may be close to each other. These image signals IMG converted by the ADC 420 to the digital data will then be easily recognized by the subsequent processing circuit. Those fingerprint images having worse resolution may also be amplified more effectively to differentiate the difference between ridges and valleys. Note that the present invention performs compensation before the image signals IMG are converted into digital data; this approach avoids signal saturation that causes the fingerprint information to be eliminated during the conversion process of the ADC 420.

Figure 5:
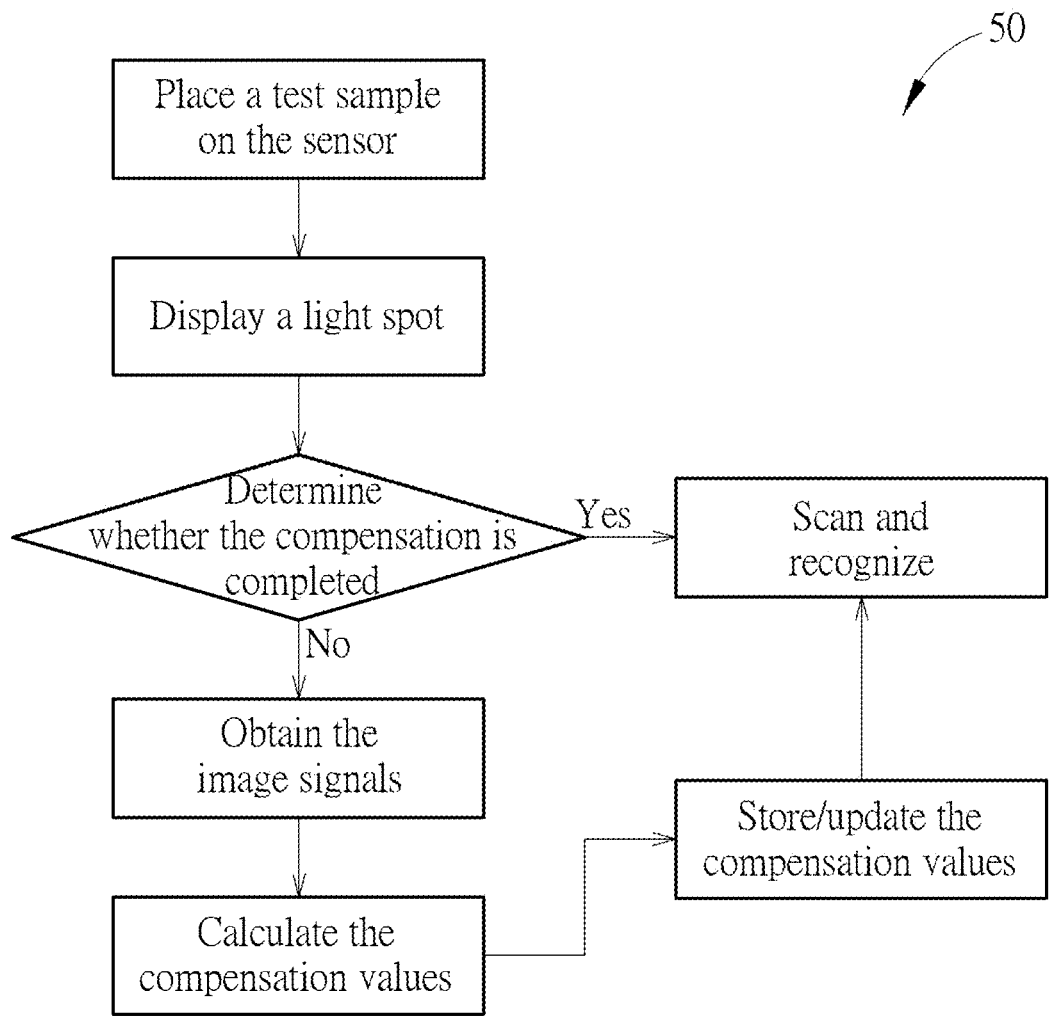
FIG. 5 is a flowchart of an image processing process according to an embodiment of the present invention.

Please refer to FIG. 5, which is a flowchart of an image processing process 50 according to an embodiment of the present invention. The image processing process 50 may be used for an image compensation circuit such as the image compensation circuit 40 shown in FIG. 4, for receiving fingerprint image signals from the image sensor 400 (which will be considered as a fingerprint sensor as an example hereinafter) and performing scan, compensation and recognition on the fingerprint image signals.

The image processing process 50 may be divided into two parts: a test process and a fingerprint recognition process. First, a test sample is placed on the sensing area of the fingerprint sensor, and simultaneously the panel corresponding to the fingerprint sensor displays a light spot to forward light to the test sample. After being reflected by the test sample, the light is gathered by the lens and then reaches the sensing pixels in the fingerprint sensor to form the image.

During the test process, the test sample may be an object having a flat surface, such as a rubber sheet. The fingerprint sensor scans the test sample to obtain the image signals IMG, and transmits the image signals IMG to the image compensation circuit 40. In the test process, the image compensation circuit 40 may determine that the compensation is not completed yet, and sequentially obtain the image signal IMG corresponding to each of the sensing pixels. At this time, since the test sample is a flat surface object without any ridge-to-valley difference of fingerprint, the image compensation circuit 40 may expect that each sensing pixel should generate the image signal IMG having the same voltage when there is no RI error. In other words, after the light is reflected by the flat object, the difference of signals sensed by the sensing pixels after lens focus may be equivalent to the RI difference that needs to be eliminated. In such a situation, based on the image signals IMG obtained by scanning, the compensation control circuit 430 may calculate the compensation value CMP corresponding to each of the sensing pixels, and store the compensation values CMP in the memory 432 or update the data of the compensation values CMP stored in the memory 432.

Subsequently, during the fingerprint recognition process, the object put on the fingerprint sensing area is a finger. At this moment, the image compensation circuit 40 determines that there is a need to perform RI compensation. Therefore, the fingerprint sensor scans and transmits the corresponding image signals IMG to the AFE circuit 410, and the DAC 414 in the AFE circuit 410 may take the corresponding compensation values CMP from the memory 432 and convert them into compensation voltages. The PGA 412 amplifies the image signals IMG which are compensated by the compensation voltages, and the image signals IMG are then transmitted to the ADC 420. The ADC 420 converts the image signals IMG to digital codes to be output, in order to perform fingerprint recognition and interpretation through the back-end processor.

Figure 6A:
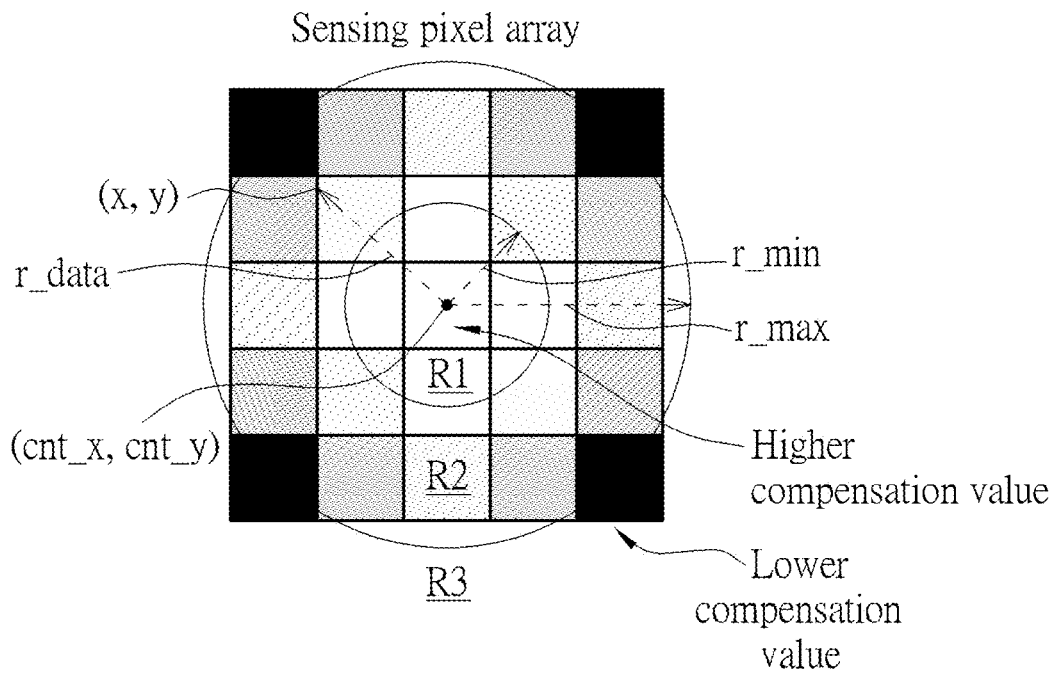
FIGS. 6A and 6B are schematic diagrams of a sensing pixel array and the corresponding compensation values according to embodiments of the present invention.

The compensation values CMP for compensating the image signals may be generated in various manners. In an embodiment, the required compensation value CMP may be determined according to the distance between the sensing pixel and the lens center. As shown in FIG. 6A, the compensation value CMP is determined based on the distance from the pixel (x, y) to the lens center (cnt_x, cnt_y) only, to compensate for the RI difference as shown in FIG. 2. In detail, in the fingerprint sensing area, an inner circle (whose radius is r min) centered on the lens center (cnt_x, cnt_y) and an outer circle (whose radius is r_max) centered on the lens center are set, wherein the radius r_max of the outer circle is greater than the radius r min of the inner circle. Based on the outer circle and the inner circle, the sensing pixels may be separated into a first area R1, a second area R2 and a third area R3, wherein the first area R1 is inside the inner circle, the second area R2 is between the inner circle and the outer circle, and the third area R3 is outside the outer circle.

Subsequently, the compensation control circuit 430 may calculate the corresponding compensation values CMP for the sensing pixels in different areas. In detail, the sensing pixels in the first area R1 are located inside the inner circle, which means that these pixels are closer to the lens center and have larger RI; hence, the compensation values CMP for these pixels may be set to a maximum value such as 255. The sensing pixels in the third area R3 are located outside the outer circle, which means that these pixels are closer to the peripheral of lens and have smaller RI; hence, the compensation values CMP for these pixels may be set to a minimum value such as 35. The sensing pixels in the second area R2 are located between the inner circle and the outer circle, and their corresponding compensation values CMP fall between the maximum value and the minimum value (i.e., between 255 and 35), and gradually decrease with increasing distance from the lens center to the pixel. As shown in FIG. 6A, with the increase of distance from the lens center to the pixel, the compensation values CMP sequentially decrease from 200, 145 to 90. Note that the values shown in FIG. 6A are one of various implementations of the present invention, and those skilled in the art may adopt appropriate compensation values to be converted into the compensation voltages according to the bit count of the DAC 414.

In an embodiment, the compensation values CMP for the sensing pixels in the second area R2 located between the inner circle and the outer circle may be calculated through the following equation:

$$CMP = (DAC\_max - DAC\_min) \times \frac{(r\_max - r\_data)}{(r\_max - r\_min)} + DAC\_min; \quad (1)$$

where r_data is a distance data representing the distance between the pixel and the lens center, and DAC_max and DAC_min refer to the maximum and the minimum compensation values, respectively. Through calculation of the above equation, it can be ensured that the compensation values CMP for the sensing pixels located between the inner circle and the outer circle may decrease linearly from the inside out, in order to effectively compensate for the RI variations caused by the optical feature of the lens.

Please note that FIG. 6A only illustrates 5×5 sensing pixels and their corresponding compensation values as an example. In fact, the image sensor may include hundreds of columns and hundreds of rows of sensing pixels, where the compensation value corresponding to each pixel may be obtained by area-based calculation in the above manner.

Figure 6B:
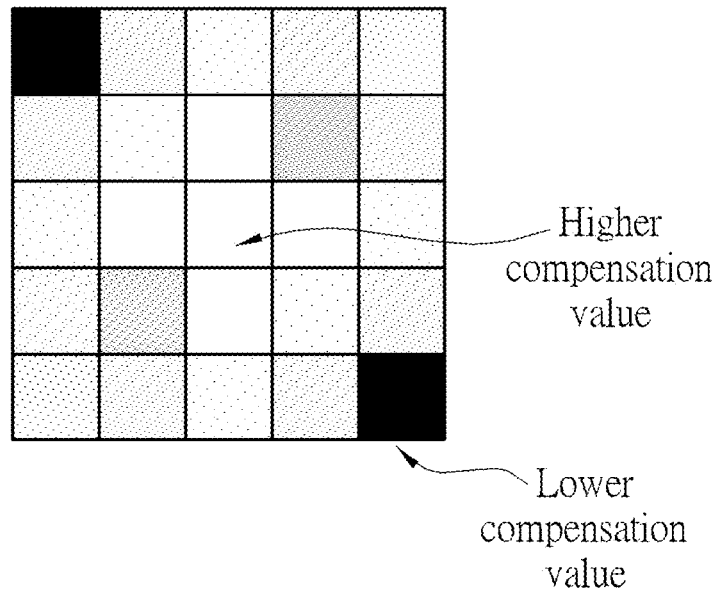

FIG. 6B illustrates another compensation method. In addition to compensating for the RI difference resulting from the lens feature, the compensation is further used for RI difference caused by the variations of light focus behavior and assembly mismatch. As mentioned above, the light is reflected by the finger and then passes through the lens to reach the sensing pixels in the image sensor. The light path should pass through different materials of the panel structure and the lens, and the light is also influenced by the assembly mismatch; hence, irregular brightness difference may be generated in the sensing pixels. Therefore, in the embodiment of FIG. 6B, the sensing pixels may be divided into several blocks, and each block corresponds to one compensation value CMP, which performs compensation to make the overall brightness identical. In the above test process, the image sensor 400 may be used to perform sensing on an object having a flat surface to generate a sensing result. The compensation control circuit 430 thereby calculates the compensation value CMP required by each block according to the sensing result. Based on the feature that the center area of the lens has higher RI and the peripheral area of the lens has lower RI, the calculated compensation values CMP will roughly comply with this trend but have slightly irregular differences, such as the distribution of compensation values CMP as shown in FIG. 6B.

Note that FIG. 6B illustrates 5×5 blocks and their corresponding compensation values CMP as an example, where each block may include any number of sensing pixels. In addition, according to the range of the sensing area and the total number of sensing pixels, the pixels in the image sensor may be divided into any number of blocks in an appropriate manner, which is not limited herein.

Figure 3:
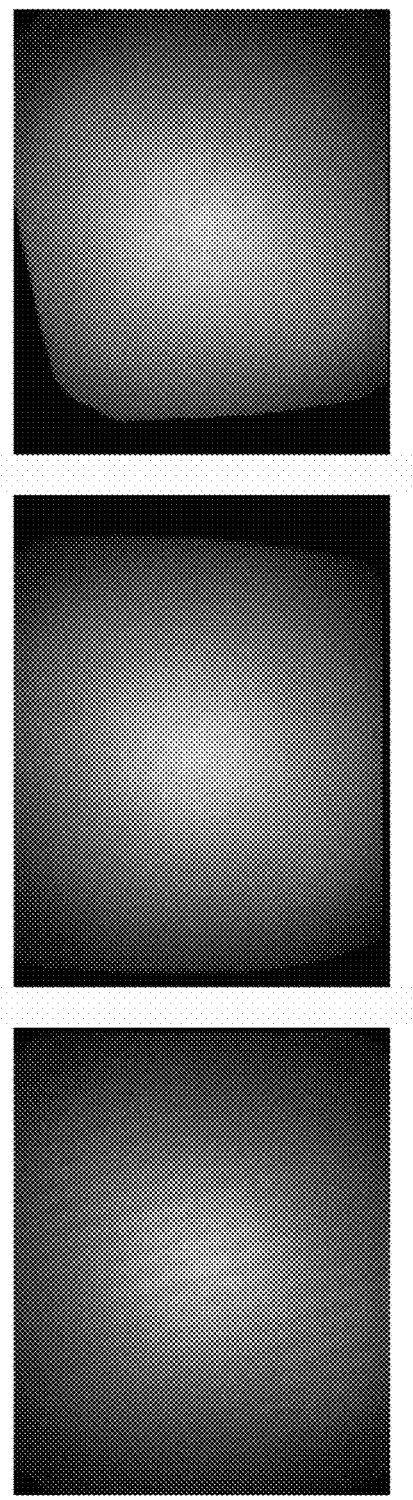
FIG. 3 illustrates fingerprint images of different fingerprint sensor modules.
Figure 7:
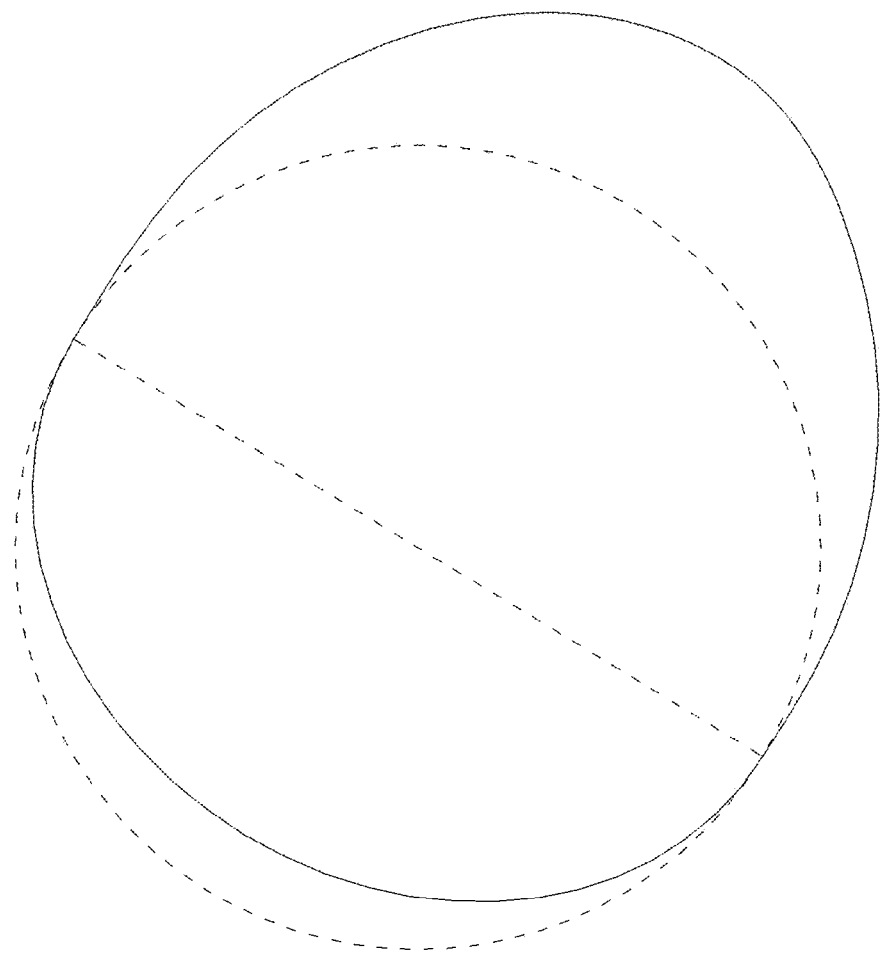
FIG. 7 is a schematic diagram of the lens tilt causing an elliptic sensing area.

In another embodiment, considering that the influences on the image signals IMG that may be caused by lens tilt, the above Equation (1) used to calculate the compensation values CMP may further be adjusted correspondingly. Referring back to FIG. 3, as shown in figures (b) and (c), when the lens tilt is found during the module test (MT) process, the border in a certain side may be blocked and cannot show a fingerprint image accurately. At this moment, the fingerprint image in the sensing area appears to not circular but elliptic, as shown in FIG. 7. In the fingerprint image, the blocked part shows a sharp decrease of brightness, and the decrease of brightness on the opposite side becomes gentler. In other words, although the image signals IMG of the fingerprint still substantially comply with the distribution that the lens center has higher RI and the lens periphery has lower RI with gradual decrease from the inside out, the decreasing speed of RI in different directions will be different.

In general, during the fingerprint sensing process, the image sensor may scan the region covered by the finger and sense light, to generate a circular image as shown in FIG. 6A. The region where the sensing pixels are scanned to obtain the fingerprint image may be considered as a region of interest (ROI). When the lens tilt occurs, partial of the scanned image may be blocked and cannot be used to obtain the fingerprint image data; hence, the ROI should be adjusted correspondingly to exclude the blocked region, preventing the image signals on the blocked position from affecting the overall fingerprint recognition result. In an embodiment, the fingerprint image may be observed and the degree of lens tilt may be determined during the MT process, so as to modify the fingerprint sensing area (e.g., the abovementioned ROI) accordingly. Alternatively, the image sensor or image compensation circuit may determine the degree of lens tilt according to the detected image content (e.g., detecting whether the image has a deviation or a region where the brightness decreases sharply), to adjust the fingerprint sensing area according to the detection result.

When the lens tilt occurs, the above Equation (1) for calculating the compensation values CMP should also be adjusted correspondingly. In an embodiment, the compensation values CMP corresponding to the sensing pixels located between the inner circle and the outer circle may be projected to the x-axis and the y-axis to be calculated. When the lens is tilted, the directions of the x-axis and the y-axis for calculating the compensation values CMP may be set according to the tilt direction of the lens. Correspondingly, the distance data r_data (i.e., the distance between the pixel and the lens center) may be multiplied by a parameter or the value of the distance data r_data may be directly adjusted. Taking FIG. 7 as an example, the x-axis and the y-axis may be set to be tilted by about 45 degrees, and the distances at the upper-right side and the lower-left side may be adjusted based on the tilt direction, so as to recalculate the appropriate compensation values CMP accordingly.

Figure 8:
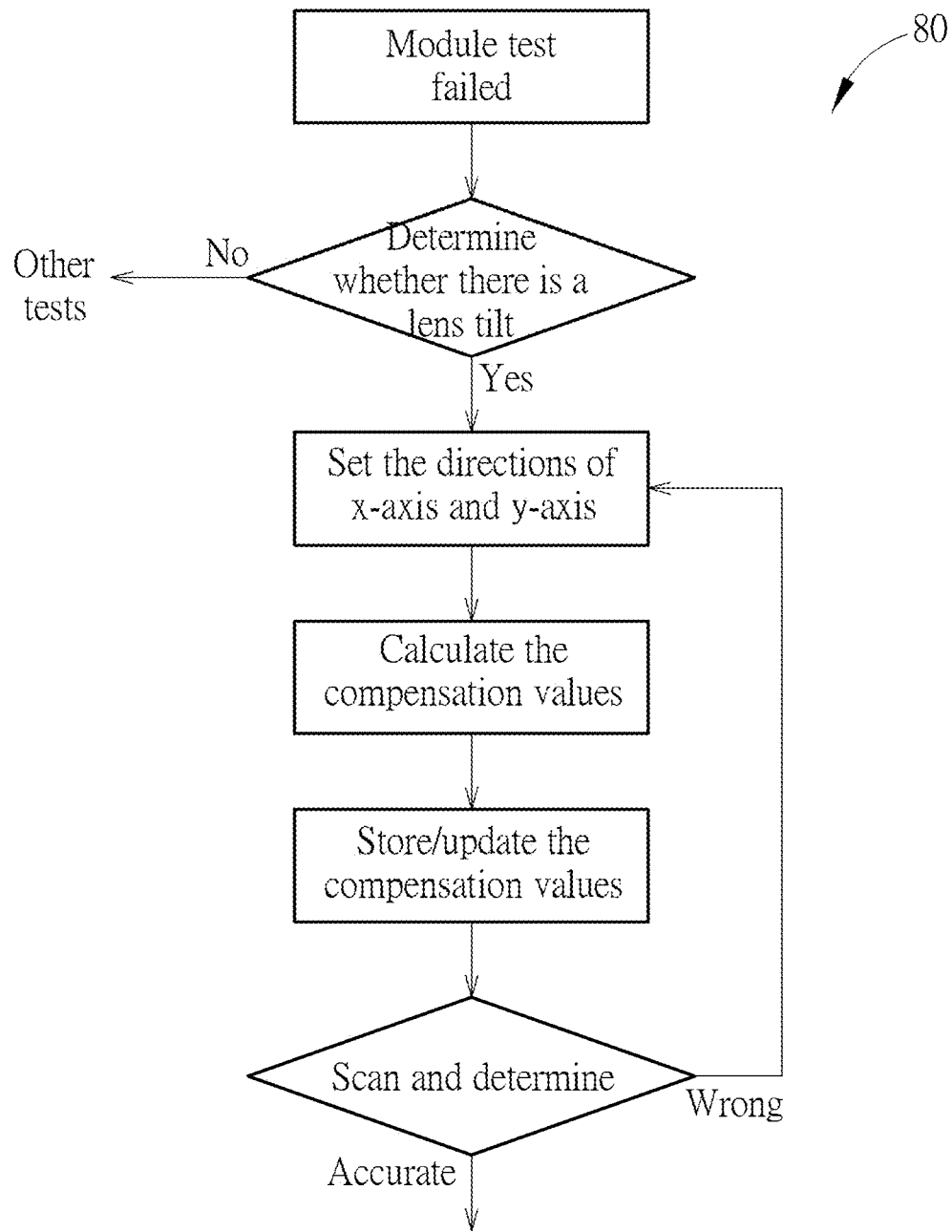
FIG. 8 is a flowchart of an image processing process for compensating for the lens tilt according to an embodiment of the present invention.

In an embodiment, the adjustment of compensation values to be adaptive to the lens tilt may be performed if the MT is failed. Please refer to FIG. 8, which is a flowchart of an image processing process 80 for compensating for the lens tilt according to an embodiment of the present invention. As shown in FIG. 8, the system may perform the MT once based on ideal compensation values CMP without deviation of lens tilt. When the MT is failed, the system may further determine whether there is a lens tilt (e.g., determining whether there is a block having brightness decreased sharply) according to the grayscale variations of the image. If it is determined that no lens tilt occurs, other tests may be performed to find out the problem. If it is determined that the lens is tilted, the compensation control circuit 430 may further calculate and set the directions of the x-axis and the y-axis according to the tilt direction of lens, and adjust the range of the ROI. Subsequently, the compensation control circuit 430 may calculate the compensation value CMP for each sensing pixel based on the new ROI, x-axis and y-axis, and then update the compensation values CMP and store the compensation values CMP in the memory 432. The image sensor 400 thereby rescans based on the updated compensation values CMP and outputs the fingerprint data to the back end to perform fingerprint recognition, so as to determine whether the fingerprint data obtained after being compensated by the new compensation values CMP are accurate. In this embodiment, if the rescan still generates a wrong recognition result, the compensation control circuit 430 may recalculate and adjust the parameters, until the accurate fingerprint recognition result is acquired.

Figure 9:
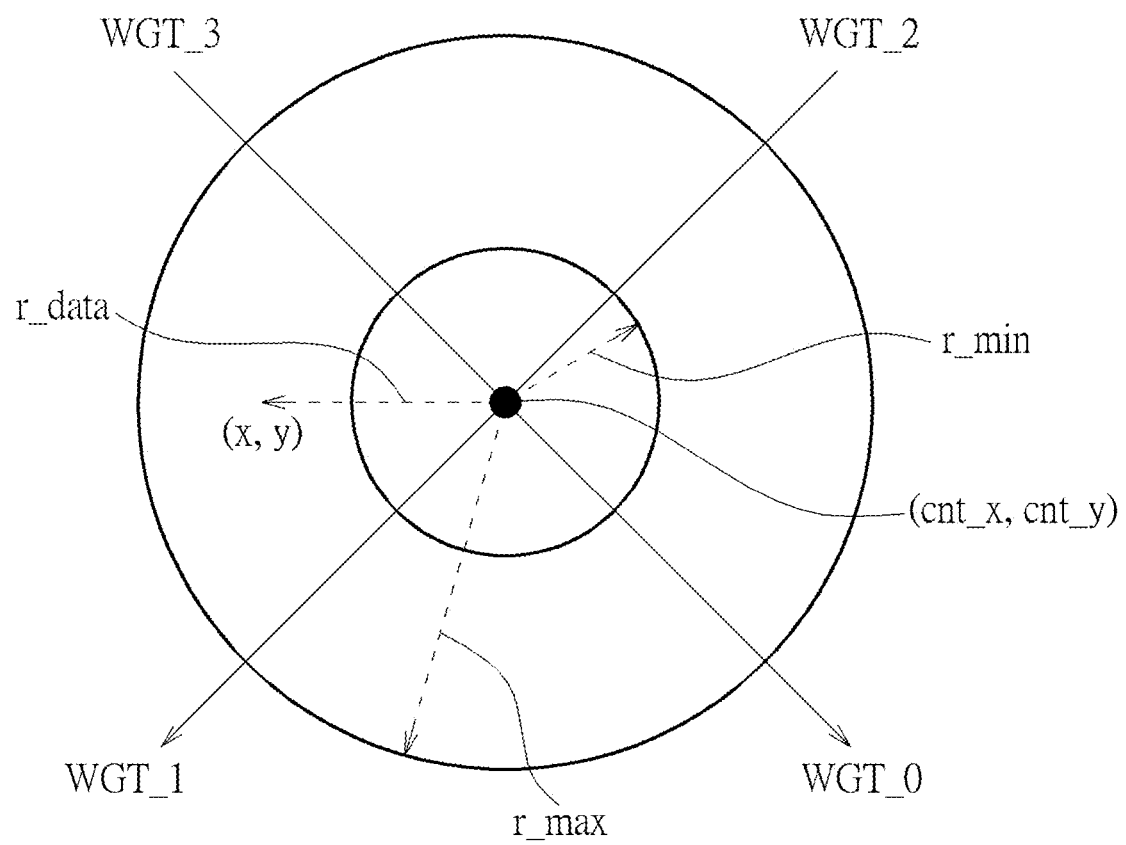
FIG. 9 is a schematic diagram of calculating the compensation values by adjusting the axes based on the tilt direction of lens according to an embodiment of the present invention.

Please refer to FIG. 9, which is a schematic diagram of calculating the compensation values by adjusting the axes based on the tilt direction of lens according to an embodiment of the present invention. As shown in FIG. 9, according to the tilt direction of lens, the x-axis and the y-axis are rotated by 45 degrees. For example, the axis from upper-right to lower-left may be considered as the x-axis, and the axis from upper-left to lower-right may be considered as the y-axis. The x-axis and the y-axis may be interchanged without affecting the illustrations of the present embodiment. In addition, the 4 directions, lower-right, lower-left, upper-right and upper-left are assigned with 4 parameters, WGT_0, WGT_1, WGT_2 and WFT_3, respectively. These parameters may correspond to the RI distribution of respective axis direction, and may be used for adjusting the compensation values of the sensing pixels along the direction. That is, the compensation values corresponding to the sensing pixels may be adjusted by using the corresponding parameters WGT_0, WGT_1, WGT_2 and/or WFT_3 according to the tilt direction and the tilt degree of the lens and also according to the position of the pixel.

Figure 10:
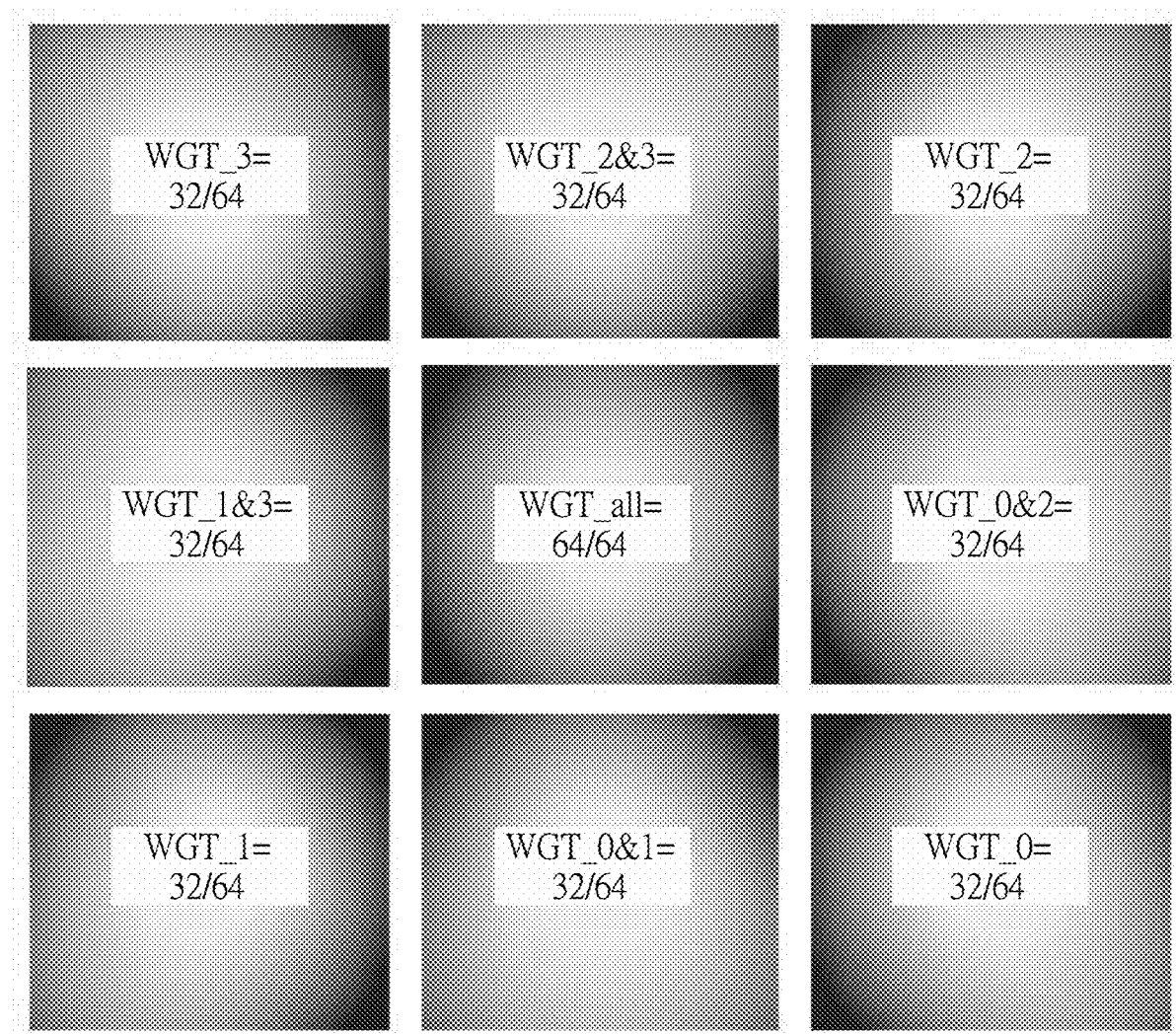
FIG. 10 illustrates generating different parameter values under different tilt directions of the lens.

Please further refer to FIG. 10, which illustrates generating different values of the parameters WGT_0, WGT_1, WGT_2 and WFT_3 under different tilt directions of the lens. For example, the middle figure is an ideal pattern without lens tilt, which has the maximum brightness in the center and the brightness decreases uniformly toward every direction; hence, the parameters WGT_0-WGT_3 along all directions may be set to 1, which means that the calculated compensation values CMP need not to be further adjusted.

As shown in the 4 figures at the upper-left, upper-right, lower-left and lower-right sides, the fingerprint image has a deviation resulting from different tilt directions of the lens, and the tilt directions correspond to the directions of 4 axes, respectively. In these figures, the lens tilt causes that the brightness decreases slowly along a certain direction; hence, the parameter WGT of the axis toward this direction may be set to 32/64, which means that the distance data r_data should be multiplied by the parameter 32/64 in the calculation of the compensation values CMP of the pixels in this direction, in order to apply the Equation (1) to obtain the compensation values CMP of the pixels. The parameter WGT=32/64 means that the speed of brightness decrease toward the direction is ½ of its normal speed. In addition, as shown in the 4 figures at the upper, lower, left and right sides, the speed of brightness decrease slows down toward the upper, lower, left and right directions, respectively; hence, the parameter WGT in the corresponding axis may be set to 32/64, and the compensation values CMP of the pixels in the corresponding directions may be calculated accordingly. Taking the upper figure as an example, the parameters WGT_2 and WGT_3 may be set to 32/64, and the compensation values CMP of the sensing pixels located in the upper half part of the sensor array may be calculated and adjusted accordingly.

In other words, the parameters WGT_0, WGT_1, WGT_2 and WGT_3 indifferent directions may be set according to the speed of brightness decrease toward the corresponding direction caused by the lens tilt. In a fingerprint image, one or more of the parameters WGT_0-WGT_3 may be adjusted based on the situation of lens tilt. Note that the above value 32/64 is only an example used to illustrate the compensation for the lowered speed of brightness decrease. The practical values may be determined based on the degree of lens tilt, and different directions may have different parameter values, so as to calculate more ideal compensation values for the image signals.

Please note that the present invention aims at providing an image compensation circuit capable of compensating the image signals output by an image sensor and the related image compensation method, which may compensation for the RI difference generated on the image signals according to various factors such as the lens feature, device variation, assembly mismatch, and/or lens tilt. Those skilled in the art may make modifications and alterations accordingly. For example, in the above embodiments, the image signals IMG are transmitted to the AFE circuit in the voltage form, and the voltage signals are converted, by the ADC, into the digital codes. In another embodiment, current signals or other type of signals may be utilized to carry the fingerprint information to be transmitted based on the type of image sensor, and the AFE circuit may convert the current signals into voltage signals and then use the compensation voltages to perform compensation. In addition, the above embodiments illustrate the operations associated with the image sensor by taking a fingerprint sensor with fingerprint signals as an example. However, those skilled in the art should understand that the embodiments of the present invention are applicable to an optical image sensor for any purpose. As long as the image sensor obtains the sensing information by using optical sensing, it may be influenced by various factors such as the illumination difference of lens, assembly mismatch and/or lens tilt so as to generate an error in the image signals. In such a situation, the image compensation circuit and method of the present invention may be applied to perform compensation.

In addition, the image compensation circuit of the present invention (such as the image compensation circuit 40 shown in FIG. 4) may be implemented in a sensor integrated circuit (IC). Also, the image sensor having the sensing pixel array may be integrated with other circuit elements of the image compensation circuit in the same IC, or may be integrated into a display panel to be implemented with a panel process, to perform sensing by using the light source of the panel. Alternatively, the image sensor may be disposed independent to the display panel and the compensation circuit. Further, the timing controller may also be integrated with other circuit elements of the image compensation circuit in the same IC, or disposed as a stand-alone IC.

Please also note that the image compensation circuit and method of the present invention are used to compensate for the RI difference corresponding to different sensing pixels in the image signals, and the RI difference usually appears as the difference of brightness. Therefore, in the above embodiments, the proposed RI difference and brightness difference are both interferences in the image signals that need to be compensated, and their names in this disclosure may be interchanged without influencing the illustrations of the embodiments.

To sum up, the present invention provides an image compensation circuit and method for compensating for the RI difference corresponding to different sensing pixels, to be used for an image sensor (such as an optical fingerprint sensor). The image compensation circuit may perform sensing during the test process, to obtain an appropriate compensation value for each pixel or block, or calculate a corresponding compensation value according to the position of the sensing pixel relative to the lens center. The image compensation circuit may also store the compensation values in a memory. Subsequently, during the fingerprint recognition process, the DAC is served to receive the compensation values from the memory and convert the compensation values into compensation voltages to perform compensation. In an embodiment, whether the lens is tilted may be determined in the MT, in order to adjust the compensation values to be adapted to the lens tilt. Through the above compensation, the brightness uniformity of the overall fingerprint image may be improved. The compensation method of the present invention may be performed in the AFE circuit in front of the ADC, to perform compensation before or after the gain amplifier amplifies the image signal in the analog domain. This prevents the image signal from being saturated when entering the ADC, to enhance the range of signal amplification. In addition, the fingerprint image having worse resolution may also be effectively amplified to analyze the difference between ridges and valleys.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image compensation circuit for an image sensor, comprising: a gain amplifier, for receiving a plurality of image signals from the image sensor and amplifying the plurality of image signals; a compensation control circuit, for generating a plurality of compensation values for the plurality of image signals; a memory, coupled to the compensation control circuit, for storing the plurality of compensation values; and a digital-to-analog converter (DAC), coupled to the memory and the gain amplifier, for converting the plurality of compensation values into a plurality of compensation voltages, respectively, to compensate the plurality of image signals with the plurality of compensation voltages, wherein the image sensor comprises a lens, the plurality of compensation values respectively correspond to a plurality of sensing pixels in the image sensor, and the plurality of compensation values are determined according to a distance between the plurality of sensing pixels and a center of the lens, respectively.

2. The image compensation circuit of claim 1, wherein the plurality of image signals are respectively received from a plurality of sensing pixels in the image sensor, and the plurality of compensation values correspond to the plurality of sensing pixels, to compensate a corresponding image signal among the plurality of image signals, respectively.

3. The image compensation circuit of claim 2, further comprising:
a timing controller, coupled to the compensation control circuit, for providing coordinate information of the plurality of sensing pixels for the compensation control circuit;
wherein the compensation control circuit generates the plurality of compensation values respectively corresponding to the plurality of sensing pixels according to the coordinate information.

4. The image compensation circuit of claim 1, wherein the plurality of image signals are first amplified by the gain amplifier, and then compensated through the plurality of compensation voltages.

5. The image compensation circuit of claim 1, wherein the plurality of image signals are first compensated through the plurality of compensation voltages, and then amplified by the gain amplifier.

6. The image compensation circuit of claim 1, wherein the plurality of sensing pixels are separated into a first area, a second area and a third area according to their distances to the center of the lens, wherein the first area is inside an inner circle centered on the center of the lens, the second area is between the inner circle and an outer circle centered on the center of the lens, and the third area is outside the outer circle.

7. The image compensation circuit of claim 6, wherein the plurality of compensation values corresponding to the plurality of sensing pixels in the first area have a maximum value, the plurality of compensation values corresponding to the plurality of sensing pixels in the third area have a minimum value, and the plurality of compensation values corresponding to the plurality of sensing pixels in the second area are between the maximum value and the minimum value and gradually decrease with increasing distance from the center of the lens.

8. The image compensation circuit of claim 6, wherein the plurality of compensation values corresponding to the plurality of sensing pixels in the second area are projected to an axis to be calculated, and when the lens is tilted, a direction of the axis is set according to a tilt direction of the lens.

9. The image compensation circuit of claim 1, wherein when the lens is tilted, the plurality of compensation values are adjusted according to a tilt direction and a tilt degree of the lens.

10. The image compensation circuit of claim 9, wherein when the lens is tilted, distance data of a plurality of sensing pixels corresponding to the plurality of compensation values are multiplied by a parameter, to adjust the plurality of compensation values.

11. The image compensation circuit of claim 1, wherein the plurality of compensation values are determined according to a sensing result generated by using the image sensor to sense a flat surface object in a test process.

12. An image compensation method for an image compensation circuit, comprising: receiving a plurality of image signals from an image sensor and amplifying the plurality of image signals; generating a plurality of compensation values for the plurality of image signals, and storing the plurality of compensation values in a memory; and converting the plurality of compensation values into a plurality of compensation voltages, respectively, to compensate the plurality of image signals with the plurality of compensation voltages, wherein the image sensor comprises a lens, the plurality of compensation values respectively correspond to a plurality of sensing pixels in the image sensor, and the image compensation method further comprises:
determining the plurality of compensation values according to a distance between the plurality of sensing pixels and a center of the lens, respectively.

13. The image compensation method of claim 12, wherein the plurality of image signals are respectively received from a plurality of sensing pixels in the image sensor, and the plurality of compensation values correspond to the plurality of sensing pixels, to compensate a corresponding image signal among the plurality of image signals, respectively.

14. The image compensation method of claim 13, further comprising:
generating the plurality of compensation values respectively corresponding to the plurality of sensing pixels according to coordinate information of the plurality of sensing pixels.

15. The image compensation method of claim 12, wherein the plurality of image signals are first amplified and then compensated through the plurality of compensation voltages.

16. The image compensation method of claim 12, wherein the plurality of image signals are first compensated through the plurality of compensation voltages and then amplified.

17. The image compensation method of claim 12, wherein the plurality of sensing pixels are separated into a first area, a second area and a third area according to their distances to the center of the lens, wherein the first area is inside an inner circle centered on the center of the lens, the second area is between the inner circle and an outer circle centered on to the center of the lens, and the third area is outside the outer circle.

18. The image compensation method of claim 17, wherein the plurality of compensation values corresponding to the plurality of sensing pixels in the first area have a maximum value, the plurality of compensation values corresponding to the plurality of sensing pixels in the third area have a minimum value, and the plurality of compensation values corresponding to the plurality of sensing pixels in the second area are between the maximum value and the minimum value and gradually decrease with increasing distance from the center of the lens.

19. The image compensation method of claim 17, wherein the plurality of compensation values corresponding to the plurality of sensing pixels in the second area are projected to an axis to be calculated, and the image compensation method further comprises:
setting a direction of the axis according to a tilt direction of the lens when the lens is tilted.

20. The image compensation method of claim 12, further comprising: adjusting the plurality of compensation values according to a tilt direction and a tilt degree of the lens when the lens is tilted.

21. The image compensation method of claim 20, wherein the step of adjusting the plurality of compensation values according to the tilt direction and the tilt degree of the lens comprises:
- multiplying distance data of a plurality of sensing pixels corresponding to the plurality of compensation values by a parameter, to adjust the plurality of compensation values.

22. The image compensation method of claim 12, further comprising:
- sensing a flat surface object by using the image sensor in a test process to generate a sensing result; and
- determining the plurality of compensation values according to the sensing result.

* * * * *